(12) United States Patent
Khlat

(10) Patent No.: US 11,431,295 B2
(45) Date of Patent: *Aug. 30, 2022

(54) MULTI-VOLTAGE GENERATION CIRCUIT AND RELATED ENVELOPE TRACKING AMPLIFIER APPARATUS

(71) Applicant: Qorvo US, Inc., Greensboro, NC (US)

(72) Inventor: Nadim Khlat, Cugnaux (FR)

(73) Assignee: QORVO US, INC., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/027,963

(22) Filed: Sep. 22, 2020

(65) Prior Publication Data

US 2021/0006206 A1 Jan. 7, 2021

Related U.S. Application Data

(63) Continuation of application No. 16/270,119, filed on Feb. 7, 2019, now Pat. No. 10,819,287.

(Continued)

(51) Int. Cl.
*H03F 1/02* (2006.01)
*H03F 3/21* (2006.01)
(Continued)

(52) U.S. Cl.
CPC .......... *H03F 1/0216* (2013.01); *H03F 3/211* (2013.01); *H03F 2200/102* (2013.01); *H03F 2200/451* (2013.01); *H03F 2203/21106* (2013.01)

(58) Field of Classification Search
CPC ............... H03F 1/0216; H03F 3/211; H03F 2203/21106; H03F 2200/451;
(Continued)

(56) References Cited

U.S. PATENT DOCUMENTS 6,529,716 B1  3/2003  Eidson et al.
6,788,151 B2  9/2004  Shvarts et al.
(Continued)

FOREIGN PATENT DOCUMENTS

EP    3644500 A1    4/2020
WO    2018182778 A1    10/2018

OTHER PUBLICATIONS

Notice of Allowance for U.S. Appl. No. 16/267,740, dated Mar. 3, 2021, 8 pages.

(Continued)

*Primary Examiner* — Hieu P Nguyen
(74) *Attorney, Agent, or Firm* — Withrow & Terranova, P.L.L.C.

(57) ABSTRACT

A multi-voltage generation circuit and related envelope tracking (ET) amplifier apparatus is provided. In one aspect, a multi-voltage generation circuit is configured to generate a number of ET target voltages based on an analog voltage signal. In another aspect, a multi-amplifier ET circuit can be configured to include a number of amplifier circuits for amplifying concurrently a radio frequency (RF) signal based on a number of ET voltages. The multi-amplifier ET circuit also includes a number of driver circuits configured to generate the ET voltages base on a number of ET target voltages. In this regard, the multi-voltage generation circuit can be provided in the multi-amplifier ET circuit to generate the ET target voltages based on the analog voltage signal that corresponds to the RF signal. In examples discussed herein, the driver circuits are co-located with the amplifier circuits to help improve efficiency and maintain linearity in the amplifier circuits.

23 Claims, 4 Drawing Sheets

Related U.S. Application Data

(60) Provisional application No. 62/748,106, filed on Oct. 19, 2018.

(51) Int. Cl.
*H03F 3/68* (2006.01)
*H03F 3/19* (2006.01)

(58) Field of Classification Search
CPC ......... H03F 2200/102; H03F 2200/511; H03F 2200/516; H03F 2200/411; H03F 3/195; H03F 3/245; H03F 3/68; H03F 1/0222
USPC .............................. 330/124 R, 295, 297, 84
See application file for complete search history.

(56) References Cited

U.S. PATENT DOCUMENTS

| | | | |
|---|---|---|---|
| 8,019,289 B2 | 9/2011 | Gorbachov | |
| 8,290,453 B2 | 10/2012 | Yoshihara | |
| 8,385,859 B2 | 2/2013 | Hamano | |
| 8,476,976 B2 | 7/2013 | Wimpenny | |
| 8,598,950 B2 | 12/2013 | Khesbak | |
| 8,600,321 B2 | 12/2013 | Nambu et al. | |
| 8,611,402 B2 | 12/2013 | Chiron | |
| 8,665,016 B2 | 3/2014 | Chowdhury et al. | |
| 8,665,931 B2 | 3/2014 | Afsahi et al. | |
| 8,803,603 B2 | 8/2014 | Wimpenny | |
| 8,816,272 B1 | 8/2014 | Brown et al. | |
| 8,816,768 B2 | 8/2014 | Tseng et al. | |
| 8,818,305 B1 | 8/2014 | Schwent et al. | |
| 8,921,774 B1 | 12/2014 | Brown et al. | |
| 8,942,651 B2 | 1/2015 | Jones | |
| 8,989,682 B2 | 3/2015 | Ripley et al. | |
| 9,002,303 B2 | 4/2015 | Brobston | |
| 9,065,509 B1 | 6/2015 | Yan et al. | |
| 9,197,162 B2 | 11/2015 | Chiron et al. | |
| 9,197,256 B2 | 11/2015 | Khlat | |
| 9,246,460 B2 | 1/2016 | Khlat et al. | |
| 9,247,496 B2 | 1/2016 | Khlat | |
| 9,270,230 B2 | 2/2016 | Henshaw et al. | |
| 9,287,829 B2 | 3/2016 | Nobbe et al. | |
| 9,288,098 B2 | 3/2016 | Yan et al. | |
| 9,294,043 B2 | 3/2016 | Ripley et al. | |
| 9,374,005 B2 | 6/2016 | Rozek et al. | |
| 9,379,667 B2 | 6/2016 | Khlat et al. | |
| 9,438,172 B2 | 9/2016 | Cohen | |
| 9,515,621 B2 | 12/2016 | Hietala et al. | |
| 9,515,622 B2 | 12/2016 | Nentwig et al. | |
| 9,516,693 B2 | 12/2016 | Khlat et al. | |
| 9,571,152 B2 | 2/2017 | Ripley et al. | |
| 9,596,110 B2 | 3/2017 | Jiang et al. | |
| 9,614,476 B2 | 4/2017 | Khlat | |
| 9,614,477 B1 | 4/2017 | Rozenblit et al. | |
| 9,641,206 B2 | 5/2017 | Pratt et al. | |
| 9,671,801 B2 | 6/2017 | Bhattad et al. | |
| 9,743,357 B2 | 8/2017 | Tabe | |
| 9,831,834 B2 | 11/2017 | Balteanu et al. | |
| 9,831,934 B2 | 11/2017 | Kotecha et al. | |
| 9,843,294 B2 | 12/2017 | Khlat | |
| 9,859,845 B2 | 1/2018 | Sarbishaei et al. | |
| 9,912,296 B1 | 3/2018 | Cheng et al. | |
| 9,912,297 B2 | 3/2018 | Khlat | |
| 9,912,301 B2 | 3/2018 | Xue et al. | |
| 9,941,844 B2 | 4/2018 | Khlat | |
| 9,948,240 B2 | 4/2018 | Khlat et al. | |
| 9,954,436 B2 | 4/2018 | Khlat | |
| 9,960,737 B1 | 5/2018 | Kovac | |
| 9,974,050 B2 | 5/2018 | Wiser et al. | |
| 9,991,851 B1 | 6/2018 | Dinur et al. | |
| 9,991,856 B2 | 6/2018 | Khesbak et al. | |
| 9,991,913 B1 | 6/2018 | Dinur et al. | |
| 10,003,303 B2 | 6/2018 | Afsahi et al. | |
| 10,069,470 B2 | 9/2018 | Khlat et al. | |
| 10,090,809 B1 | 10/2018 | Khlat | |
| 10,097,387 B1 | 10/2018 | Wiser et al. | |
| 10,103,926 B1 | 10/2018 | Khlat | |
| 10,110,169 B2 | 10/2018 | Khesbak et al. | |
| 10,141,891 B2 | 11/2018 | Gomez et al. | |
| 10,158,330 B1 | 12/2018 | Khlat | |
| 10,171,037 B2 | 1/2019 | Khlat | |
| 10,171,038 B1 | 1/2019 | Chen et al. | |
| 10,181,826 B2 | 1/2019 | Khlat et al. | |
| 10,204,775 B2 | 2/2019 | Brown et al. | |
| 10,305,429 B2 * | 5/2019 | Choo | H03F 3/19 |
| 10,326,408 B2 | 6/2019 | Khlat et al. | |
| 10,355,646 B2 | 7/2019 | Lee et al. | |
| 10,361,660 B2 | 7/2019 | Khlat | |
| 10,382,147 B2 | 8/2019 | Ripley et al. | |
| 10,396,716 B2 | 8/2019 | Afsahi et al. | |
| 10,419,255 B2 | 9/2019 | Wiser et al. | |
| 10,432,145 B2 | 10/2019 | Khlat | |
| 10,439,557 B2 | 10/2019 | Khlat et al. | |
| 10,439,789 B2 | 10/2019 | Brunel et al. | |
| 10,454,428 B2 | 10/2019 | Khesbak et al. | |
| 10,476,437 B2 | 11/2019 | Nag et al. | |
| 2004/0100323 A1 | 5/2004 | Khanifer et al. | |
| 2009/0128236 A1 | 5/2009 | Wilson | |
| 2009/0253389 A1 | 10/2009 | Ma et al. | |
| 2011/0223875 A1 | 9/2011 | Hamano | |
| 2012/0142304 A1 | 6/2012 | Degani et al. | |
| 2012/0146731 A1 | 6/2012 | Khesbak | |
| 2012/0194274 A1 | 8/2012 | Fowers et al. | |
| 2012/0302179 A1 | 11/2012 | Brobston | |
| 2012/0309333 A1 | 12/2012 | Nambu et al. | |
| 2013/0141159 A1 | 6/2013 | Strange et al. | |
| 2013/0207731 A1 | 8/2013 | Balteanu | |
| 2013/0285750 A1 | 10/2013 | Chowdhury et al. | |
| 2014/0111279 A1 | 4/2014 | Brobston | |
| 2014/0218109 A1 | 8/2014 | Wimpenny | |
| 2014/0306763 A1 | 10/2014 | Hong et al. | |
| 2014/0306769 A1 | 10/2014 | Khlat et al. | |
| 2014/0361837 A1 | 12/2014 | Strange et al. | |
| 2015/0009980 A1 | 1/2015 | Modi et al. | |
| 2015/0091645 A1 | 4/2015 | Park et al. | |
| 2015/0123628 A1 | 5/2015 | Bhattad et al. | |
| 2015/0194988 A1 | 7/2015 | Yan et al. | |
| 2015/0236729 A1 | 8/2015 | Peng et al. | |
| 2016/0036389 A1 | 2/2016 | Balteanu et al. | |
| 2016/0050629 A1 | 2/2016 | Khesbak et al. | |
| 2016/0094185 A1 | 3/2016 | Shute | |
| 2016/0094186 A1 | 3/2016 | Cohen | |
| 2016/0099686 A1 | 4/2016 | Perreault et al. | |
| 2016/0105151 A1 | 4/2016 | Langer | |
| 2016/0181995 A1 | 6/2016 | Nentwig et al. | |
| 2016/0204809 A1 | 7/2016 | Pratt et al. | |
| 2016/0226448 A1 | 8/2016 | Wimpenny | |
| 2016/0294587 A1 | 10/2016 | Jiang et al. | |
| 2017/0070199 A1 | 3/2017 | Anderson et al. | |
| 2017/0077877 A1 | 3/2017 | Anderson | |
| 2017/0093340 A1 | 3/2017 | Khesbak | |
| 2017/0207802 A1 | 7/2017 | Pratt et al. | |
| 2017/0230924 A1 | 8/2017 | Wolberg et al. | |
| 2017/0279412 A1 | 9/2017 | Afsahi et al. | |
| 2017/0353287 A1 | 12/2017 | Onaka et al. | |
| 2018/0048276 A1 | 2/2018 | Khlat et al. | |
| 2018/0138862 A1 | 5/2018 | Balteanu et al. | |
| 2018/0138863 A1 | 5/2018 | Khlat | |
| 2018/0159476 A1 | 6/2018 | Balteanu et al. | |
| 2018/0159566 A1 | 6/2018 | Dinur et al. | |
| 2018/0287564 A1 | 10/2018 | Afsahi et al. | |
| 2018/0309409 A1 | 10/2018 | Khlat | |
| 2018/0309414 A1 | 10/2018 | Khlat et al. | |
| 2018/0316440 A1 | 11/2018 | Mita | |
| 2018/0358930 A1 | 12/2018 | Haine | |
| 2019/0036493 A1 | 1/2019 | Khlat et al. | |
| 2019/0044480 A1 | 2/2019 | Khlat | |
| 2019/0089310 A1 | 3/2019 | Khlat et al. | |
| 2019/0109566 A1 | 4/2019 | Folkmann et al. | |
| 2019/0109613 A1 | 4/2019 | Khlat et al. | |
| 2019/0181804 A1 | 6/2019 | Khlat | |
| 2019/0222176 A1 | 7/2019 | Khlat | |
| 2019/0222181 A1 | 7/2019 | Khlat | |
| 2019/0267947 A1 | 8/2019 | Khlat et al. | |

(56) References Cited

U.S. PATENT DOCUMENTS

| | | |
|---|---|---|
| 2019/0356285 A1 | 11/2019 | Khlat et al. |
| 2020/0036337 A1 | 1/2020 | Khlat |
| 2020/0076375 A1 | 3/2020 | Khlat |
| 2020/0076376 A1 | 3/2020 | Khlat |
| 2020/0127607 A1 | 4/2020 | Khlat |
| 2020/0127608 A1 | 4/2020 | Khlat |
| 2020/0127609 A1 | 4/2020 | Khlat |
| 2020/0127611 A1 | 4/2020 | Khlat |
| 2020/0127612 A1 | 4/2020 | Khlat et al. |
| 2020/0127625 A1 | 4/2020 | Khlat |
| 2020/0127730 A1 | 4/2020 | Khlat |
| 2020/0136575 A1 | 4/2020 | Khlat et al. |
| 2020/0350878 A1 | 11/2020 | Drogi et al. |

OTHER PUBLICATIONS

Notice of Allowance for U.S. Appl. No. 16/267,740, dated Mar. 30, 2021, 7 pages.

Quayle Action for U.S. Appl. No. 16/250,298, dated Feb. 3, 2021, 5 pages.

Notice of Allowance for U.S. Appl. No. 16/250,298, dated Apr. 15, 2021, 8 pages.

Non-Final Office Action for U.S. Appl. No. 16/689,236, dated Mar. 2, 2021, 15 pages.

Notice of Allowance for U.S. Appl. No. 16/263,368, dated Apr. 29, 2021, 7 pages.

Non-Final Office Action for U.S. Appl. No. 16/660,900, dated Feb. 18, 2021, 7 pages.

Notice of Allowance for U.S. Appl. No. 16/689,417, dated Feb. 24, 2021, 7 pages.

Non-Final Office Action for U.S. Appl. No. 16/263,368, dated Dec. 26, 2019, 6 pages.

Notice of Allowance for U.S. Appl. No. 16/273,288, dated Dec. 13, 2019, 8 pages.

Non-Final Office Action for U.S. Appl. No. 16/263,316, dated Dec. 23, 2019, 9 pages.

Notice of Allowance for U.S. Appl. No. 16/193,513, dated Mar. 25, 2020, 8 pages.

Non-Final Office Action for U.S. Appl. No. 16/250,229, dated Apr. 29, 2020, 7 pages.

Non-Final Office Action for U.S. Appl. No. 16/267,740, dated Apr. 30, 2020, 10 pages.

Final Office Action for U.S. Appl. No. 16/263,316, dated May 13, 2020, 10 pages.

Non-Final Office Action for U.S. Appl. No. 16/278,886, dated Apr. 29, 2020, 9 pages.

Quayle Action for U.S. Appl. No. 16/267,779, dated May 1, 2020, 8 pages.

Final Office Action for U.S. Appl. No. 16/263,368, dated May 22, 2020, 9 pages.

Notice of Allowance for U.S. Appl. No. 16/250,229, dated Sep. 22, 2020, 7 pages.

Quayle Action for U.S. Appl. No. 16/267,740, dated Oct. 19, 2020, 7 pages.

Non-Final Office Action for U.S. Appl. No. 16/263,316, dated Jul. 17, 2020, 4 pages.

Non-Final Office Action for U.S. Appl. No. 16/263,316, dated Nov. 24, 2020, 4 pages.

Notice of Allowance for U.S. Appl. No. 16/270,119, dated Jun. 18, 2020, 9 pages.

Notice of Allowance for U.S. Appl. No. 16/278,886, dated Sep. 22, 2020, 8 pages.

Non-Final Office Action for U.S. Appl. No. 16/250,298, dated Aug. 20, 2020, 8 pages.

Non-Final Office Action for U.S. Appl. No. 16/263,368, dated Aug. 7, 2020, 4 pages.

Notice of Allowance for U.S. Appl. No. 16/508,768, dated Oct. 27, 2020, 9 pages.

Quayle Action for U.S. Appl. No. 16/514,339, dated Nov. 19, 2020, 9 pages.

Non-Final Office Action for U.S. Appl. No. 16/263,368, dated Dec. 17, 2020, 8 pages.

Notice of Allowance for U.S. Appl. No. 16/508,704, dated Dec. 30, 2020, 7 pages.

Notice of Allowance for U.S. Appl. No. 16/689,236, dated Jun. 9, 2021, 7 pages.

Non-Final Office Action for U.S. Appl. No. 16/669,728, dated Jun. 3, 2021, 9 pages.

Notice of Allowance and Examiner-Initiated Interview Summary for U.S. Appl. No. 16/669,728, dated Dec. 8, 2021, 8 pages.

International Search Report and Written Opinion for International Patent Application No. PCT/US2021/052151, dated Jan. 4, 2022, 16 pages.

Extended European Search Report for European Patent Application No. 22152966.2, dated Jun. 23, 2022, 9 pages.

* cited by examiner

MULTI-VOLTAGE GENERATION CIRCUIT AND RELATED ENVELOPE TRACKING AMPLIFIER APPARATUS

RELATED APPLICATION

This application is a continuation of U.S. patent application Ser. No. 16/270,119, filed on Feb. 7, 2019, now U.S. Pat. No. 10,819,287 issued Oct. 27, 2020, which claims the benefit of U.S. provisional patent application No. 62/748,106, filed on Oct. 19, 2018, the disclosures of which are incorporated herein by reference in their entireties.

FIELD OF THE DISCLOSURE

The technology of the disclosure relates generally to an envelope tracking (ET) amplifier apparatus in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of power amplifiers to help reduce power consumption and thermal dissipation in a mobile communication device. In an ET system, an ET power amplifier(s) amplifies an RF signal(s) based on time-variant voltages generated in accordance to time-variant amplitudes of the RF signal(s). The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signal(s). Notably, the better the time-variant voltage envelope tracks the time-variant power envelope, the higher efficiency can be achieved in the ET power amplifier(s). In this regard, it may be necessary for the ET system to constantly adjust the time-variant voltages applied to the ET power amplifier(s) to ensure that the ET power amplifier(s) can consistently operate at a desired efficiency for any given instantaneous power requirement of the RF signal(s).

SUMMARY

Aspects disclosed in the detailed description include a multi-voltage generation circuit and related envelope tracking (ET) amplifier apparatus. In one aspect, a multi-voltage generation circuit can be configured to generate a number of ET target voltages based on an analog voltage signal. In another aspect, a multi-amplifier ET circuit can be configured to include a number of amplifier circuits for amplifying concurrently a radio frequency (RF) signal based on a number of ET voltages. The multi-amplifier ET circuit also includes a number of driver circuits configured to generate the ET voltages base on a number of ET target voltages. In this regard, the multi-voltage generation circuit can be provided in the multi-amplifier ET circuit to generate the ET target voltages based on the analog voltage signal that corresponds to the RF signal. In examples discussed herein, the driver circuits are co-located with the amplifier circuits to help improve efficiency and maintain linearity in the amplifier circuits, particularly when the RF signal is modulated at a higher modulation bandwidth (e.g., >80 MHz).

In one aspect, a multi-voltage generation circuit is provided. The multi-voltage generation circuit includes a signal interface. The signal interface is configured to receive an analog voltage signal corresponding to a time-variant power envelope from a transceiver circuit coupled to the signal interface. The multi-voltage generation circuit also includes a number of analog multipliers. The analog amplifiers are configured to multiply the analog voltage signal by a number of voltage scaling factors to generate a number of target voltage signals having a number of time-variant target power envelopes conforming to the time-variant power envelope. The multi-voltage generation circuit also includes a plurality of analog look-up table (LUT) circuits. The analog LUT circuits are configured to convert the target voltage signals into a number of ET target voltages having a number of time-variant target voltage envelopes corresponding to the time-variant target power envelopes, respectively.

In another aspect, a multi-amplifier ET circuit is provided. The multi-amplifier ET circuit includes a number of amplifier circuits configured to amplify concurrently an RF signal based on a number of ET voltages and a number of low-frequency currents, respectively. The multi-amplifier ET circuit also includes a common port configured to receive a common low-frequency current. The multi-amplifier ET circuit also includes a number of driver circuits coupled in parallel between the common port and the amplifier circuits. The driver circuits are configured to receive the common low-frequency current from the common port. The driver circuits are also configured to receive a number of ET target voltages, respectively. The driver circuits are also configured to generate the ET voltages based on the ET target voltages, respectively. The driver circuits are also configured to generate the low-frequency currents, respectively, based on the common low-frequency current. The multi-amplifier ET circuit also includes a multi-voltage generation circuit. The multi-voltage generation circuit includes a signal interface. The signal interface is configured to receive an analog voltage signal corresponding to a time-variant power envelope from a transceiver circuit coupled to the signal interface. The multi-voltage generation circuit also includes a number of analog multipliers. The analog multipliers are configured to multiply the analog voltage signal by a number of voltage scaling factors to generate a number of target voltage signals having a number of time-variant target power envelopes conforming to the time-variant power envelope. The multi-voltage generation circuit also includes a plurality of analog look-up table (LUT) circuits. The analog LUT circuits are configured to convert the target voltage signals into a number of ET target voltages having a number of time-variant target voltage envelopes corresponding to the time-variant target power envelopes, respectively. The analog LUT circuits are also configured to provide the plurality of ET target voltages to the plurality of driver circuits, respectively.

In another aspect, an ET amplifier apparatus is provided. The ET amplifier apparatus includes a multi-amplifier ET circuit. The multi-amplifier ET circuit includes a number of amplifier circuits configured to amplify concurrently an RF signal based on a number of ET voltages and a number of low-frequency currents, respectively. The multi-amplifier ET circuit also includes a common port configured to receive a common low-frequency current. The multi-amplifier ET circuit also includes a number of driver circuits coupled in parallel between the common port and the amplifier circuits. The driver circuits are configured to receive the common low-frequency current from the common port. The driver circuits are also configured to receive a number of ET target voltages, respectively. The driver circuits are also configured to generate the ET voltages based on the ET target voltages, respectively. The driver circuits are also configured to generate the low-frequency currents, respectively, based on the common low-frequency current. The ET amplifier apparatus also includes an ET tracker circuit configured to provide the common low-frequency current to the common port. The ET tracker circuit also includes a multi-voltage generation circuit. The multi-voltage generation circuit includes a signal interface. The signal interface is configured to receive an analog voltage signal corresponding to a time-variant power envelope from a transceiver circuit coupled to the signal interface. The multi-voltage generation circuit also includes a number of analog multipliers. The analog multipliers are configured to multiply the analog voltage signal by a number of voltage scaling factors to generate a number of target voltage signals having a number of time-variant target power envelopes conforming to the time-variant power envelope. The multi-voltage generation circuit also includes a plurality of analog look-up table (LUT) circuits. The analog LUT circuits are configured to convert the target voltage signals into a number of ET target voltages having a number of time-variant target voltage envelopes corresponding to the time-variant target power envelopes, respectively. The analog LUT circuits are also configured to provide the plurality of ET target voltages to the plurality of driver circuits, respectively.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
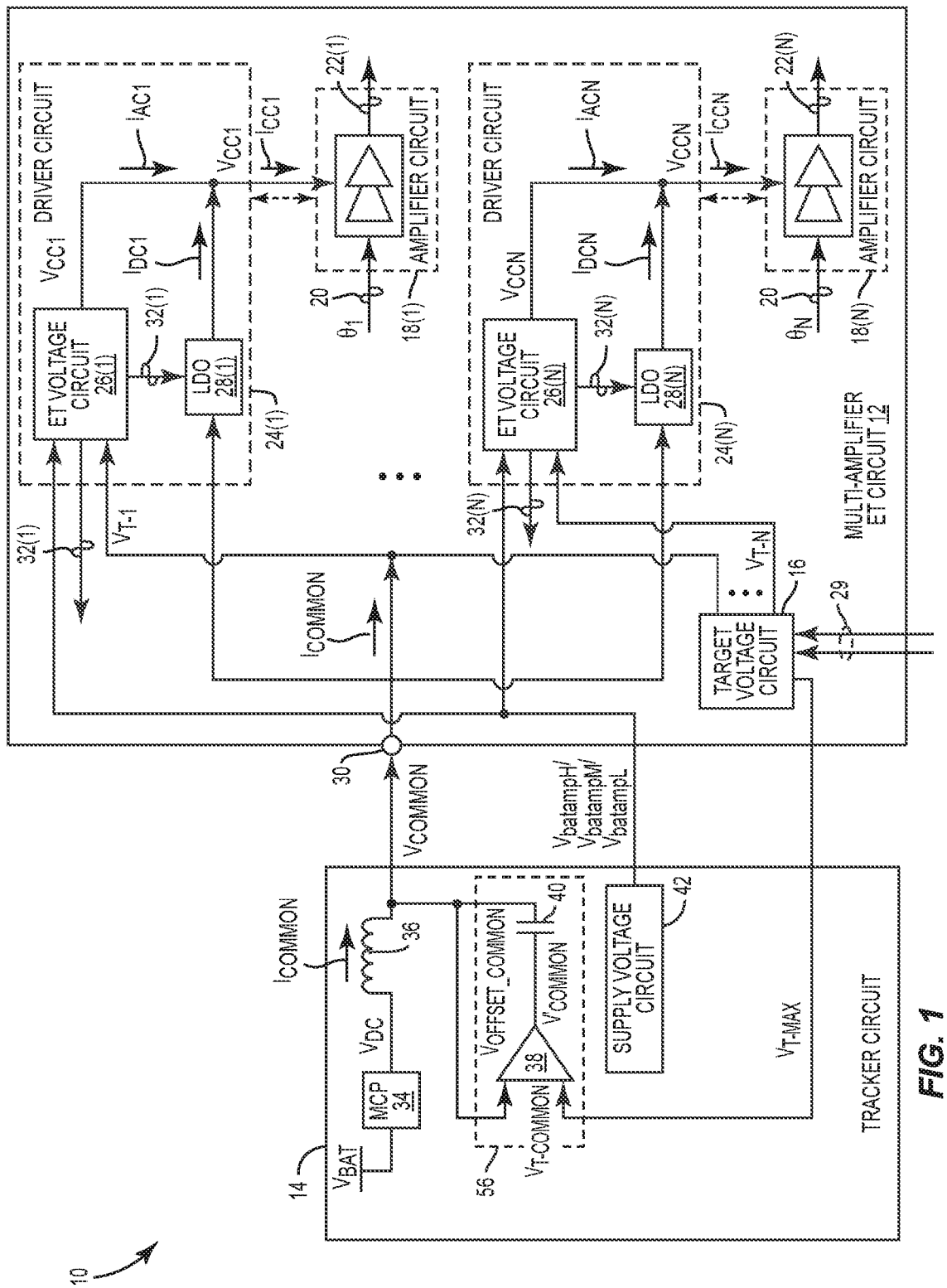
FIG. 1 is a schematic diagram of an exemplary envelope tracking (ET) amplifier apparatus that includes a multi-amplifier ET circuit and a tracker circuit, wherein the multi-amplifier ET circuit includes a target voltage circuit for generating a number of ET target voltages.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a multi-voltage generation circuit and related envelope tracking (ET) amplifier apparatus. In one aspect, a multi-voltage generation circuit can be configured to generate a number of ET target voltages based on an analog voltage signal. In another aspect, a multi-amplifier ET circuit can be configured to include a number of amplifier circuits for amplifying concurrently a radio frequency (RF) signal based on a number of ET voltages. The multi-amplifier ET circuit also includes a number of driver circuits configured to generate the ET voltages base on a number of ET target voltages. In this regard, the multi-voltage generation circuit can be provided in the multi-amplifier ET circuit to generate the ET target voltages based on the analog voltage signal that corresponds to the RF signal. In examples discussed herein, the driver circuits are co-located with the amplifier circuits to help improve efficiency and maintain linearity in the amplifier circuits, particularly when the RF signal is modulated at a higher modulation bandwidth (e.g., >80 MHz).

Figure 2:
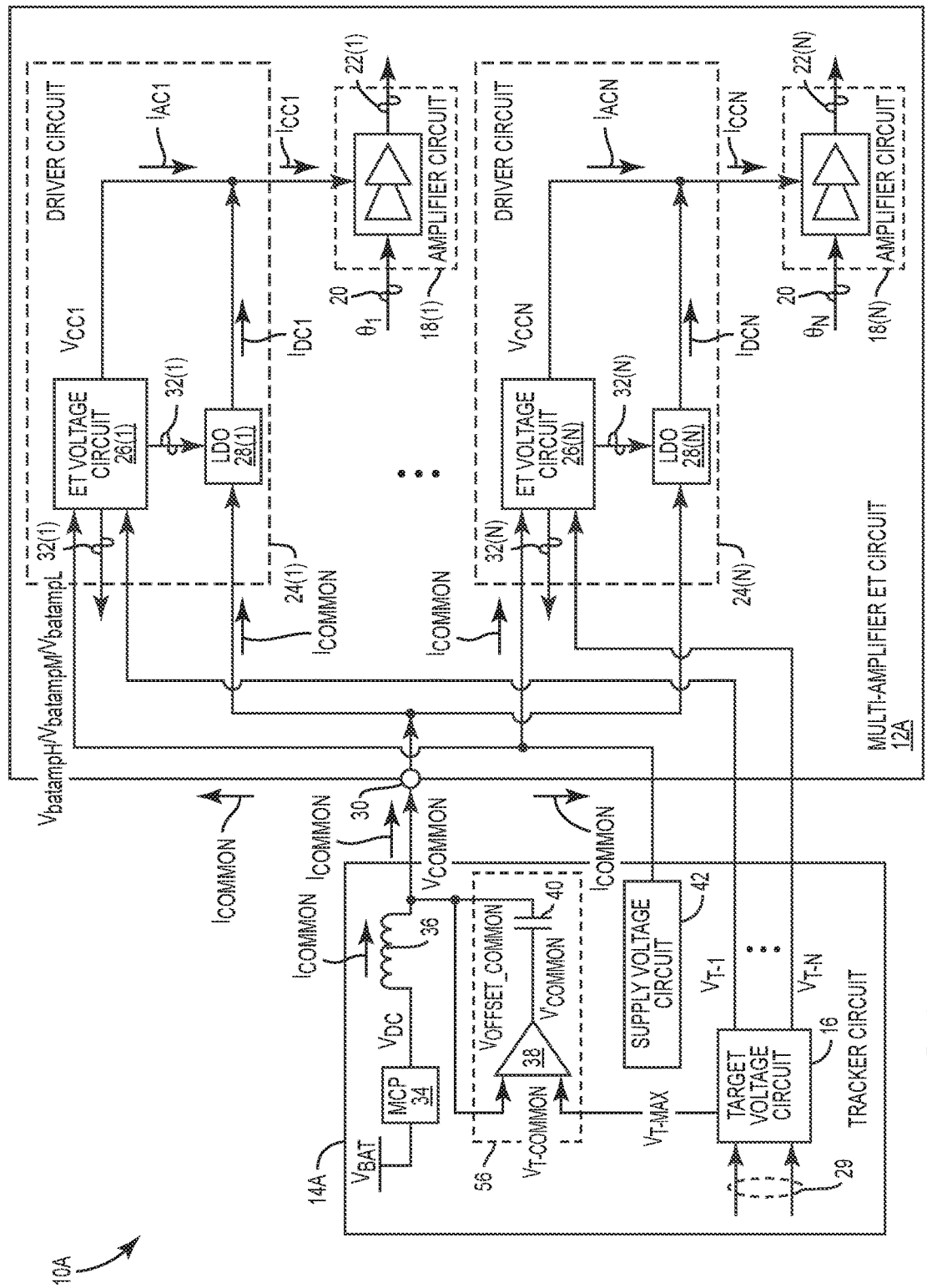
FIG. 2 is a schematic diagram of an exemplary ET amplifier apparatus that includes a multi-amplifier ET circuit and a tracker circuit, wherein the tracker circuit includes a target voltage circuit for generating a number of ET target voltages.

Before discussing a multi-voltage generation circuit of the present disclosure, a brief overview of an ET amplifier apparatus(es) configured to generate a number of ET voltages based on a number of ET target voltages is first provided with reference to FIGS. 1 and 2. The discussion of specific exemplary aspects of the multi-voltage generation circuit of the present disclosure, which can be provided in the ET amplifier apparatus(es) for generating the ET target voltages, starts below with reference to FIG. 3.

In this regard, FIG. 1 is a schematic diagram of an exemplary ET amplifier apparatus 10 that includes a multi-amplifier ET circuit 12 and a tracker circuit 14, wherein the multi-amplifier ET circuit 12 includes a target voltage circuit 16 for generating a plurality of ET target voltages $V_{T-1}$-$V_{T-N}$. The multi-amplifier ET circuit 12 includes a plurality of amplifier circuits 18(1)-18(N) configured to amplify concurrently an RF signal 20 to generate a plurality of amplified RF signals 22(1)-22(N), respectively. In a non-limiting example, the RF signal 20 can be a fifth-generation new-radio (5G-NR) communication signal configured to be transmitted in a millimeter wave (mmWave) spectrum (e.g., >28 GHz). In this regard, the multi-amplifier ET circuit 12 may be coupled to an antenna array (not shown) configured to radiate concurrently the amplified RF signals 22(1)-22(N) in a formed RF beam(s) to a receiving device (not shown).

Notably, the amplified RF signals 22(1)-22(N) may arrive at the receiving device via different propagation paths. As a result, the amplified RF signals 22(1)-22(N) received by the receiving device may experience different propagation delays and/or propagation attenuations. To ensure that the amplified RF signals 22(1)-22(N) can be coherently combined (e.g., linearly combined) at the receiving device, the RF signal 20 may be pre-processed (e.g., phase shifted) prior to being amplified by the amplifier circuits 18(1)-18(N). In this regard, the RF signal 20 being amplified by the amplifier circuits 18(1)-18(N) may be associated with different phases $\theta_1$-$\theta_N$ configured to accommodate for the propagation delays of the amplified RF signals 22(1)-22(N), respectively. Further, the amplifier circuits 18(1)-18(N) may be configured to amplify the RF signal 20 to different power levels to compensate for the propagation attenuations of the amplified RF signals 22(1)-22(N). In this regard, the amplified RF signals 22(1)-22(N) may correspond to a plurality of time-variant power envelopes that conform to a time-variant power envelope of the RF signal 20.

Hereinafter, a first time-variant envelope is said to conform to a second time-variant envelope when the first time-variant envelope is similar (e.g., having the same shape, outline, or contour) to the second time-variant envelope. In this regard, the peaks and bottoms of the first time-variant envelope may be proportional or identical to the peaks and bottoms of the second time-variant envelope.

The amplifier circuits 18(1)-18(N) are configured to amplify the RF signal 20 based on a plurality of ET voltages $V_{CC1}$-$V_{CCN}$ and a plurality of currents $I_{CC1}$-$I_{CCN}$, respectively. Each of the currents $I_{CC1}$-$I_{CCN}$ may include a low-frequency current (e.g., a direct current) and a high-frequency current (e.g., an alternating current). In this regard, the currents $I_{CC1}$-$I_{CCN}$ may include a plurality of low-frequency currents $I_{DC1}$-$I_{DCN}$ and a plurality of high-frequency currents $I_{AC1}$-$I_{ACN}$, respectively ($I_{CCX}$=$I_{DDX}$+$I_{ACX}$, $1 \leq X \leq N$).

The multi-amplifier ET circuit 12 includes a plurality of driver circuits 24(1)-24(N) configured to generate the ET voltages $V_{CC1}$-$V_{CCN}$ and the currents $I_{CC1}$-$I_{CCN}$ for the amplifier circuits 18(1)-18(N), respectively. The driver circuits 24(1)-24(N) include a plurality of ET voltage circuits 26(1)-26(N) and a plurality of regulator circuits 28(1)-28(N) (denoted as "LDO"), respectively. The ET voltage circuits 26(1)-26(N) are coupled to the amplifier circuits 18(1)-18(N) and configured to generate the ET voltages $V_{CC1}$-$V_{CCN}$ for the amplifier circuits 18(1)-18(N), respectively. To ensure that the amplifier circuits 18(1)-18(N) can generate the amplified RF signals 22(1)-22(N) with the time-variant power envelopes that conform to the time-variant power envelope of the RF signal 20, the ET voltage circuits 26(1)-26(N) may be configured to generate the ET voltages $V_{CC1}$-$V_{CCN}$ based on the ET target voltages $V_{T-1}$-$V_{T-N}$, respectively. More specifically, the ET target voltages $V_{T-1}$-$V_{T-N}$ can be configured to have a plurality of time-variant target voltage envelopes that track the time-variant power envelope of the RF signal 20. As the time-variant target voltage envelopes of the ET target voltages $V_{T-1}$-$V_{T-N}$ rise and fall in accordance to the rise and fall of the time-variant power envelope of the RF signal 20, the ET voltages $V_{CC1}$-$V_{CCN}$ may rise and fall in accordance to the rise and fall of the time-variant power envelope of the RF signal 20 as well. Accordingly, the time-variant power envelopes of the amplified RF signals 22(1)-22(N) may conform to the time-variant power envelope of the RF signal 20.

The target voltage circuit 16 is configured to generate the ET target voltages $V_{T-1}$-$V_{T-N}$ based on a target voltage signal 29. In a non-limiting example, the target voltage signal 29 is generated based on the time-variant power envelope of the RF signal 20 and a target voltage look-up table (LUT) (not shown). The target voltage circuit 16 may be configured to provide the ET target voltages $V_{T-1}$-$V_{T-N}$ to the ET voltage circuits 26(1)-26(N), respectively.

The multi-amplifier ET circuit 12 includes a common port 30 configured to receive a common low-frequency current $I_{COMMON}$ (e.g., a direct current). The regulator circuits 28(1)-28(N) may be coupled in parallel between the common port 30 and the amplifier circuits 18(1)-18(N), respectively. As previously mentioned, the currents $I_{CC1}$-$I_{CCN}$ may include both the low-frequency currents $I_{DC1}$-$I_{DCN}$ and the high-frequency currents $I_{AC1}$-$I_{ACN}$, respectively. In this regard, the regulator circuits 28(1)-28(N) are configured to receive the common low-frequency current $I_{COMMON}$ from the common port 30 and generate the low-frequency currents $I_{DC1}$-$I_{DCN}$ in the currents $I_{CC1}$-$I_{CCN}$, respectively, based on the common current $I_{COMMON}$.

In a non-limiting example, the ET voltage circuits 26(1)-26(N) can be configured to generate at least a portion of the high-frequency currents $I_{AC1}$-$I_{ACN}$ in the currents $I_{CC1}$-$I_{CCN}$, respectively. Similar to the ET voltages $V_{CC1}$-$V_{CCN}$, the currents $I_{CC1}$-$I_{CCN}$ may need to rise and fall in accordance to the rises and falls of the time-variant power envelope of the RF signal 20. In this regard, the regulator circuits 28(1)-28(N) may be configured to adjust the common low-frequency current $I_{COMMON}$ to increase or decrease the low-frequency currents $I_{DC1}$-$I_{DCN}$, respectively. Likewise, the ET voltage circuits 26(1)-26(N) may be configured to source the high-frequency currents $I_{AC1}$-$I_{ACN}$ (e.g., when the time-variant power envelope transitions from average to peak) or sink the high-frequency currents $I_{AC1}$-$I_{ACN}$ (e.g., when the time-variant power envelope transitions from peak to average). Collectively, the ET voltage circuits 26(1)-26(N) and the regulator circuits 28(1)-28(N) can cause the currents $I_{CC1}$-$I_{CCN}$ to rise and fall in accordance to the rises and falls of the time-variant power envelope of the RF signal 20.

The ET voltage circuits 26(1)-26(N) can be configured to generate a plurality of sense current signals 32(1)-32(N), respectively. The sense current signals 32(1)-32(N) may be configured to indicate the high-frequency currents $I_{AC1}$-$I_{ACN}$ that are sourced or sank by the ET voltage circuits 26(1)-26(N), respectively. In a non-limiting example, the regulator circuits 28(1)-28(N) can be configured to adjust the common low-frequency current $I_{COMMON}$ to generate the low-frequency currents $I_{CC1}$-$I_{DCN}$ based on the sense current signals 32(1)-32(N), respectively.

The tracker circuit 14 may include a multi-level charge pump (MCP) 34. The MCP 34 is configured to generate a direct current voltage $V_{DC}$ based on a battery voltage $V_{BAT}$. In a non-limiting example, the MCP 34 can be configured to generate the direct current voltage $V_{DC}$ at 0V, $V_{BAT}$, or 2×$V_{BAT}$. The MCP 34 is coupled in series to an inductor 36, which is configured to induce the common low-frequency current $I_{COMMON}$ based on the direct current voltage $V_{DC}$ and provide the common low-frequency current $I_{COMMON}$ to the common port 30.

The tracker circuit 14 may include a common voltage amplifier 38 configured to generate an initial common modulated voltage $V'_{COMMON}$ based on a common ET target voltage $V_{T-COMMON}$. The common voltage amplifier 38 may be coupled in series to a common offset capacitor 40, which may be configured to raise the initial common modulated voltage $V'_{COMMON}$ by a common offset voltage $V_{OFFSET-COMMON}$ (e.g., 0.8V) to generate a common modulated voltage $V_{COMMON}$ ($V_{COMMON}=V'_{COMMON}+V_{OFFSET-COMMON}$) at the common port 30. The common modulated voltage $V_{COMMON}$ is configured to make sure that the common low-frequency current $I_{COMMON}$ always flow from the common port 30 toward the amplifier circuits 18(1)-18(N). Notably, the ET voltage circuits 26(1)-26(N) may generate the ET voltages $V_{CC1}$-$V_{CCN}$ that rise and fall in accordance to the rise and fall of the time-variant power envelope of the RF signal 20. In this regard, to ensure that the common low-frequency current $I_{COMMON}$ always flows from the common port 30 toward the amplifier circuits 18(1)-18(N), the common modulated voltage $V_{COMMON}$ needs to be greater than or equal to a highest ET voltage among the ET voltages $V_{CC1}$-$V_{CCN}$.

In this regard, the target voltage circuit 16 may be further configured to determine a maximum ET target voltage $V_{T-MAX}$ among the ET target voltages $V_{T-1}$-$V_{T-N}$ and provide the maximum ET target voltage $V_{T-MAX}$ to the common voltage amplifier 38 as the common ET target voltage $V_{T-COMMON}$. Accordingly, the common voltage amplifier 38 in series with the common offset capacitor 40 may generate the common modulated voltage $V_{COMMON}$ higher than the ET voltages $V_{CC1}$-$V_{CCN}$.

The tracker circuit 14 may include a supply voltage circuit 42. The supply voltage circuit 42 may be configured to generate a number of supply voltages $V_{batampH}$, $V_{batampM}$, and $V_{batampL}$ ($V_{batampH}>V_{batampM}>V_{batampL}$). The supply voltage circuit 42 may be configured to provide one or more of the supply voltages $V_{batampH}$, $V_{batampM}$, and $V_{batampL}$ to each of the ET voltage circuits 26(1)-26(N).

FIG. 2 is a schematic diagram of an exemplary ET amplifier apparatus 10A that includes a multi-amplifier ET circuit 12A and a tracker circuit 14A, wherein the tracker circuit 14A includes the target voltage circuit 16 of FIG. 1 for generating the ET target voltages $V_{T-1}$-$V_{T-N}$. Common elements between FIGS. 1 and 2 are shown therein with common element numbers and will not be re-described herein.

Figure 3:
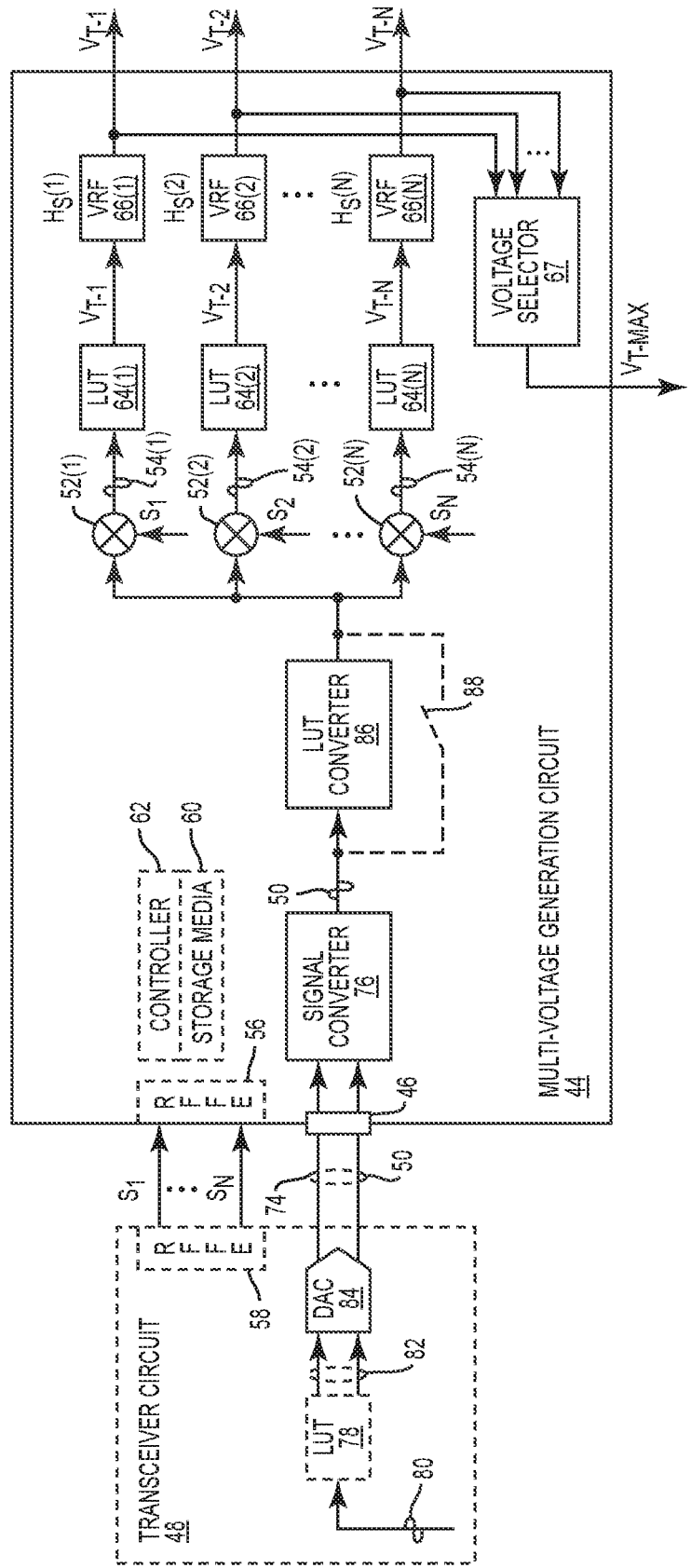
FIG. 3 is a schematic diagram of an exemplary multi-voltage generation circuit, which can be configured to function as the target voltage circuit in the ET amplifier apparatuses of FIGS. 1 and 2 to generate the ET target voltages.

FIG. 3 is a schematic diagram of an exemplary multi-voltage generation circuit 44, which can be configured to function as the target voltage circuit 16 in the ET amplifier apparatus 10 of FIG. 1 and the ET amplifier apparatus 10A of FIG. 2 to generate the ET target voltages $V_{T-1}$-$V_{T-N}$. The multi-voltage generation circuit 44 includes a signal interface 46. In a non-limiting example, the signal interface 46 can be coupled to a transceiver circuit 48 to receive an analog voltage signal 50, which may be equivalent to the target voltage signal 29 in FIGS. 1 and 2. In this regard, the analog voltage signal 50 may correspond to a time-variant power envelope that conforms to the time-variant power envelope of the RF signal 20 in FIGS. 1 and 2.

The multi-voltage generation circuit 44 includes a plurality of analog multipliers 52(1)-52(N) coupled to the signal interface 46. The analog multipliers 52(1)-52(N) are configured to multiply the analog voltage signal 50 by a plurality of voltage scaling factors $S_1$-$S_N$ to generate a plurality of target voltage signals 54(1)-54(N), respectively. The target voltage signals 54(1)-54(N) may correspond to a plurality of time-variant target power envelopes that conform to the time-variant power envelope of the analog voltage signal 50. Notably, the voltage scaling factors $S_1$-$S_N$ may be fractional scaling factors ($S_1$-$S_N$<1). In this regard, the analog multipliers 52(1)-52(N) may instead be analog attenuators.

In a non-limiting example, the multi-voltage generation circuit 44 can be configured to receive the voltage scaling factors $S_1$-$S_N$ via a radio frequency front end (RFFE) interface 56, which is coupled to a corresponding RFFE interface 58 in the transceiver circuit 48. The multi-voltage generation circuit 44 may include a storage media 60 (e.g., a register, a flash storage, a memory, etc.) configured to store the voltage scaling factors $S_1$-$S_N$ received from the transceiver circuit 48. The multi-voltage generation circuit 44 may include a controller 62, such as a microprocessor for example. The controller 62 may be configured to retrieve the voltage scaling factors $S_1$-$S_N$ from the storage media 60 and configure the analog multipliers 52(1)-52(N) accordingly.

The multi-voltage generation circuit 44 includes a plurality of analog LUT circuits 64(1)-64(N) coupled to the analog multipliers 52(1)-52(N), respectively. The analog LUT circuits 64(1)-64(N) are configured to convert the target voltage signals 54(1)-54(N) into the ET target voltages $V_{T-1}$-$V_{T-N}$, respectively. The ET target voltages $V_{T-1}$-$V_{T-N}$ may correspond to a plurality of time-variant target voltage envelopes that conform to the time-variant target power envelopes of the target voltage signals 54(1)-54(N), and thus the time-variant power envelope of the analog voltage signal 50. In this regard, given that the analog voltage signal 50 is equivalent to the target voltage signal 29 and the target voltage signal 29 is generated based on the time-variant power envelope of the RF signal 20, the time-variant target voltage envelopes of the ET target voltages $V_{T-1}$-$V_{T-N}$ may conform to the time-variant power envelope of the RF signal 20 as well.

The multi-voltage generation circuit 44 may further include a plurality of voltage processing circuits 66(1)-66(N) (denoted as "VRF") coupled to the analog LUT circuits 64(1)-64(N), respectively. The voltage processing circuits 66(1)-66(N) may be configured to equalize and/or filter the ET target voltages $V_{T-1}$-$V_{T-N}$ based on a plurality of predefined voltage transfer functions $H_S(1)$-$H_S(N)$, respectively. In a non-limiting example, each of the predefined voltage transfer functions $H_S(1)$-$H_S(N)$ can be a complex-pole transfer function or a real-pole/real-zero transfer function.

The multi-voltage generation circuit 44 may further include a voltage selector 67. The voltage selector 67 may be configured to determine and output the maximum target voltage $V_{T-MAX}$ among the ET target voltages $V_{T-1}$-$V_{T-N}$.

Figure 4A:
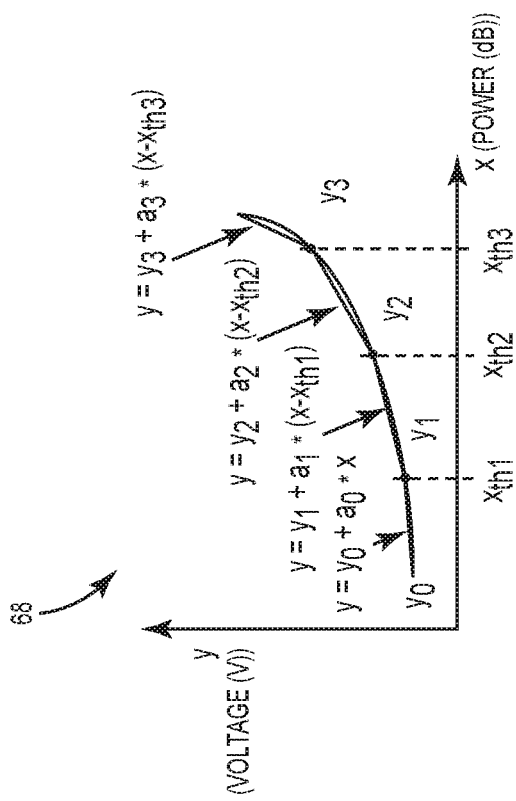
FIG. 4A is a graphic diagram providing an exemplary illustration of an analog look-up table (LUT) that can be employed in the multi-voltage generation circuit of FIG. 3 to generate the ET target voltages.

FIG. 4A is a graphic diagram providing an exemplary illustration of an analog LUT 68 that can be employed in each of the analog LUT circuits 64(1)-64(N) in the multi-voltage generation circuit 44 of FIG. 3 to generate the ET target voltages $V_{T-1}$-$V_{T-N}$. The analog LUT 68 is plotted relative to an x-axis representing power in unit of decibel (dB) and a y-axis representing voltage in unit of volt (V).

The analog LUT 68 is configured to operate based on a number of predefined power thresholds $X_{th1}$, $X_{th2}$, and $X_{th3}$, for example. It should be appreciated that the analog LUT 68 can include more or less than the predefined power thresholds $X_{th1}$, $X_{th2}$, and $X_{th3}$ as needed. In one non-limiting example, when an instantaneous power x of the analog voltage signal 50 is less than the predefined power threshold $X_{th1}$ ($x<X_{th1}$) the analog LUT 68 can be configured to convert the instantaneous power x of the analog voltage signal 50 into an instantaneous ET target voltage y based on the linear voltage function $y=y_0+a_0*x$, wherein $a_0$ represents a slope of the linear voltage function. In another non-limiting example, when an instantaneous power x of the analog voltage signal 50 is greater than or equal to the predefined power threshold $X_{th1}$ but less than the predefined power threshold $X_{th2}$ ($X_{th1} \leq x < X_{th2}$) the analog LUT 68 can be configured to convert the instantaneous power x of the analog voltage signal 50 into an instantaneous ET target voltage y based on the linear voltage function $y=y_1+a_1*(x-X_{th1})$, wherein $a_1$ represents a slope of the linear voltage function. In another non-limiting example, when an instantaneous power x of the analog voltage signal 50 is greater than or equal to the predefined power threshold $X_{th2}$ but less than the predefined power threshold $X_{th3}$ ($X_{th2} \leq x < X_{th3}$) the analog LUT 68 can be configured to convert the instantaneous power x of the analog voltage signal 50 into an instantaneous ET target voltage y based on the linear voltage function $y=y_2+a_2*(x-X_{th2})$, wherein $a_2$ represents a slope of the linear voltage function. In another non-limiting example, when an instantaneous power x of the analog voltage signal 50 is greater than or equal to the predefined power threshold $X_{th3}$ ($X_{th3} \leq x$) the analog LUT 68 can be configured to convert the instantaneous power x of the analog voltage signal 50 into an instantaneous ET target voltage y based on the linear voltage function $y=y_3+a_3*(x-X_{th3})$, wherein $a_3$ represents a slope of the linear voltage function.

Figure 4B:
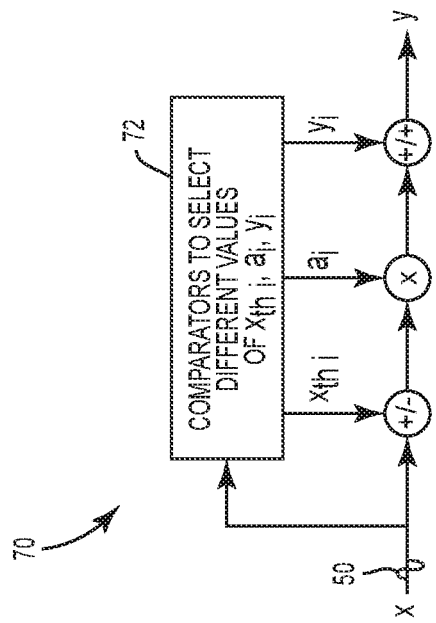
FIG. 4B is a schematic diagram of an exemplary circuit that can be employed in the multi-voltage generation circuit of FIG. 3 to implement the analog LUT of FIG. 4A.

FIG. 4B is a schematic diagram of an exemplary circuit 70 that can be employed in each of the analog LUT circuits 64(1)-64(N) in the multi-voltage generation circuit 44 of FIG. 3 to implement the analog LUT 68 of FIG. 4A. Common elements between FIGS. 3, 4A, and 4B are shown therein with common element numbers and will not be re-described herein.

The circuit 70 includes a comparator 72 configured to compare an instantaneous power x of the analog voltage signal 50 against the predefined power thresholds $X_{thi}$ ($1 \leq i \leq 3$, for example) to determine an appropriate linear voltage function as discussed above in FIG. 4A. Accordingly, the comparator 72 may determine $a_i$ and $y_i$ ($1 \leq i \leq 3$, for example) in the corresponding linear voltage function. Based on the selected linear voltage function, the circuit 70 is able to convert the instantaneous power x of the analog voltage signal 50 into an instantaneous ET target voltage y among the ET target voltages $V_{T-1}$-$V_{T-N}$.

With reference back to FIG. 3, the multi-voltage generation circuit 44 may receive the analog voltage signal 50 as a differential analog voltage signal 74. In this regard, the multi-voltage generation circuit 44 may include a signal converter 76 configured to convert the differential analog voltage signal 74 into the analog voltage signal 50.

The transceiver circuit 48 may include an LUT circuit 78. The LUT circuit 78 may receive a digital signal 80 corresponding to the time-variant power envelope of the RF signal 20 in FIGS. 1 and 2. The LUT circuit 78 may convert the digital signal 80 into a digital voltage signal 82, which corresponds to a time-variant voltage envelope. The transceiver circuit 48 may include a digital-to-analog converter (DAC) 84 coupled to the LUT circuit 78. The DAC 84 may convert the digital voltage signal 82 into the analog voltage signal 50 and provide the analog voltage signal 50 to the signal interface 46.

However, given that the LUT circuit 78 generates the digital voltage signal 82 corresponding to the time-variant voltage envelope, the analog voltage signal 50 is now corresponding to the time-variant voltage envelope, as opposed to the time-variant power envelope of the RF signal 20. In this regard, the multi-voltage generation circuit 44 may further include an LUT converter 86 configured to undo the conversion performed by the LUT circuit 78. Specifically, the LUT converter 86 can be configured to convert the analog voltage signal 50 from corresponding to the time-variant voltage envelope back to corresponding to the time-variant power envelope.

Notably, it may be possible to configure the LUT circuit 78 in the transceiver circuit 48 to convert the time-variant power envelope of the digital signal 80 into the time-variant voltage envelope of the digital voltage signal 82 based on a one-to-one (1:1) ratio. As such, the time-variant voltage envelope of the digital voltage signal 82 may mirror the time-variant power envelope of the digital signal 80. In this regard, the LUT converter 86 may be bypassed via a bypass switch 88 to help reduce insertion loss.

Those skilled in the art will recognize improvements and modifications to the embodiments of the present disclosure.

All such improvements and modifications are considered within the scope of the concepts disclosed herein and the claims that follow.

What is claimed is:

1. A multi-voltage generation circuit comprising:
a signal interface configured to receive an analog voltage signal corresponding to a time-variant power envelope from a transceiver circuit coupled to the signal interface; and
a plurality of analog circuits configured to concurrently generate a plurality of envelope tracking (ET) target voltages as a function of the analog voltage signal and a plurality of voltage scaling factors.

2. The multi-voltage generation circuit of claim 1 wherein the plurality of analog circuits comprises:
a plurality of analog multipliers configured to multiply the analog voltage signal by the plurality of voltage scaling factors to generate a plurality of target voltage signals having a plurality of time-variant target power envelopes conforming to the time-variant power envelope; and
a plurality of analog look-up table (LUT) circuits configured to convert the plurality of target voltage signals into the plurality of ET target voltages having a plurality of time-variant target voltage envelopes corresponding to the plurality of time-variant target power envelopes, respectively.

3. The multi-voltage generation circuit of claim 2 further comprising a plurality of voltage processing circuits coupled to the plurality of analog LUT circuits and configured to equalize the plurality of ET target voltages based on a plurality of predefined voltage transfer functions, respectively.

4. The multi-voltage generation circuit of claim 2 configured to receive the plurality of voltage scaling factors from the transceiver circuit.

5. The multi-voltage generation circuit of claim 4 further comprising:
a storage media configured to store the plurality of voltage scaling factors; and
a controller configured to:
retrieve the plurality of voltage scaling factors from the storage media; and
configure the plurality of analog multipliers to multiply the analog voltage signal by the plurality of voltage scaling factors.

6. The multi-voltage generation circuit of claim 1 further comprising a signal converter configured to:
receive a differential analog voltage signal from the signal interface; and
convert the differential analog voltage signal into the analog voltage signal.

7. The multi-voltage generation circuit of claim 1 wherein the transceiver circuit comprises:
an LUT circuit configured to:
receive a digital signal corresponding to the time-variant power envelope; and
convert the digital signal into a digital voltage signal corresponding to a time-variant voltage envelope; and
a digital-to-analog converter (DAC) configured to:
convert the digital voltage signal into the analog voltage signal corresponding to the time-variant voltage envelope; and
provide the analog voltage signal to the signal interface.

8. The multi-voltage generation circuit of claim 7 further comprising an LUT converter configured to convert the analog voltage signal from corresponding to the time-variant voltage envelope to corresponding to the time-variant power envelope.

9. The multi-voltage generation circuit of claim 1 further comprising a voltage selector configured to output a maximum ET target voltage among the plurality of ET target voltages.

10. A multi-amplifier envelope tracking (ET) circuit comprising:
a plurality of amplifier circuits configured to amplify concurrently a radio frequency (RF) signal based on a plurality of ET voltages and a plurality of low-frequency currents, respectively;
a common port configured to receive a common low-frequency current;
a plurality of driver circuits coupled in parallel between the common port and the plurality of amplifier circuits, the plurality of driver circuits configured to:
receive the common low-frequency current from the common port;
receive a plurality of ET target voltages, respectively;
generate the plurality of ET voltages based on the plurality of ET target voltages, respectively; and
generate the plurality of low-frequency currents, respectively, based on the common low-frequency current; and
a multi-voltage generation circuit comprising:
a signal interface configured to receive an analog voltage signal corresponding to a time-variant power envelope from a transceiver circuit coupled to the signal interface; and
a plurality of analog circuits configured to generate a plurality of ET target voltages as a function of the analog voltage signal and a plurality of voltage scaling factors.

11. The multi-amplifier ET circuit of claim 10 wherein the plurality of analog circuits comprises:
a plurality of analog multipliers configured to multiply the analog voltage signal by the plurality of voltage scaling factors to generate a plurality of target voltage signals having a plurality of time-variant target power envelopes conforming to the time-variant power envelope; and
a plurality of analog look-up table (LUT) circuits configured to:
convert the plurality of target voltage signals into a plurality of ET target voltages having a plurality of time-variant target voltage envelopes corresponding to the plurality of time-variant target power envelopes, respectively; and
provide the plurality of ET target voltages to the plurality of driver circuits, respectively.

12. The multi-amplifier ET circuit of claim 11 wherein the multi-voltage generation circuit further comprises a plurality of voltage processing circuits coupled to the plurality of analog LUT circuits and configured to equalize the plurality of ET target voltages based on a plurality of predefined voltage transfer functions, respectively.

13. The multi-amplifier ET circuit of claim 11 wherein the multi-voltage generation circuit is further configured to receive the plurality of voltage scaling factors from the transceiver circuit.

14. The multi-amplifier ET circuit of claim 13 wherein the multi-voltage generation circuit further comprises:

a storage media configured to store the plurality of voltage scaling factors; and a controller configured to:
retrieve the plurality of voltage scaling factors from the storage media; and
configure the plurality of analog multipliers to multiply the analog voltage signal by the plurality of voltage scaling factors.

15. The multi-amplifier ET circuit of claim 11 wherein the multi-voltage generation circuit further comprises a voltage selector configured to output a maximum ET target voltage among the plurality of ET target voltages.

16. The multi-amplifier ET circuit of claim 11 wherein the plurality of driver circuits comprises:
a plurality of ET voltage circuits configured to:
receive the plurality of ET target voltages, respectively; and
generate the plurality of ET voltages based on the plurality of ET target voltages, respectively; and
a plurality of regulator circuits configured to:
receive the common low-frequency current from the common port; and
adjust the common low-frequency current to generate the plurality of low-frequency currents, respectively.

17. An envelope tracking (ET) amplifier apparatus comprising:
a multi-amplifier ET circuit comprising:
a plurality of amplifier circuits configured to amplify concurrently a radio frequency (RF) signal based on a plurality of ET voltages and a plurality of low-frequency currents, respectively;
a common port configured to receive a common low-frequency current; and
a plurality of driver circuits coupled in parallel between the common port and the plurality of amplifier circuits, the plurality of driver circuits configured to:
receive the common low-frequency current from the common port;
receive a plurality of ET target voltages, respectively;
generate the plurality of ET voltages based on the plurality of ET target voltages, respectively; and
generate the plurality of low-frequency currents, respectively, based on the common low-frequency current; and
an ET tracker circuit configured to provide the common low-frequency current to the common port, the ET tracker circuit comprising a multi-voltage generation circuit comprising:
a signal interface configured to receive an analog voltage signal corresponding to a time-variant power envelope from a transceiver circuit coupled to the signal interface; and
a plurality of analog circuits configured to generate a plurality of ET target voltages as a function of the analog voltage signal and a plurality of voltage scaling factors.

18. The ET amplifier apparatus of claim 17 wherein the plurality of analog circuits comprises:
a plurality of analog multipliers configured to multiply the analog voltage signal by the plurality of voltage scaling factors to generate a plurality of target voltage signals having a plurality of time-variant target power envelopes conforming to the time-variant power envelope; and
a plurality of analog look-up table (LUT) circuits configured to:
convert the plurality of target voltage signals into a plurality of ET target voltages having a plurality of time-variant target voltage envelopes corresponding to the plurality of time-variant target power envelopes, respectively; and
provide the plurality of ET target voltages to the plurality of driver circuits, respectively.

19. The ET amplifier apparatus of claim 18 wherein the multi-voltage generation circuit further comprises a plurality of voltage processing circuits coupled to the plurality of analog LUT circuits and configured to equalize the plurality of ET target voltages based on a plurality of predefined voltage transfer functions, respectively.

20. The ET amplifier apparatus of claim 18 wherein the multi-voltage generation circuit is further configured to receive the plurality of voltage scaling factors from the transceiver circuit.

21. The ET amplifier apparatus of claim 20 wherein the multi-voltage generation circuit further comprises:
a storage media configured to store the plurality of voltage scaling factors; and
a controller configured to:
retrieve the plurality of voltage scaling factors from the storage media; and
configure the plurality of analog multipliers to multiply the analog voltage signal by the plurality of voltage scaling factors.

22. The ET amplifier apparatus of claim 17 wherein the multi-voltage generation circuit further comprises a voltage selector configured to output a maximum ET target voltage among the plurality of ET target voltages.

23. The ET amplifier apparatus of claim 17 wherein the ET tracker circuit comprises:
a multi-level charge pump (MCP) configured to generate a direct current voltage based on a battery voltage; and
an inductor coupled in series to the MCP and configured to induce the common low-frequency current based on the direct current voltage.

* * * * *